(12) United States Patent
Rathert et al.

(10) Patent No.: US 11,798,827 B2
(45) Date of Patent: Oct. 24, 2023

(54) SYSTEMS AND METHODS FOR SEMICONDUCTOR ADAPTIVE TESTING USING INLINE DEFECT PART AVERAGE TESTING

(71) Applicant: KLA Corporation, Milpitas, CA (US)

(72) Inventors: Robert J. Rathert, Mechanicsville, VA (US); David W. Price, Austin, TX (US); Chet V. Lenox, Lexington, TX (US); Oreste Donzella, San Ramon, CA (US); Kara L. Sherman, San Jose, CA (US); John Robinson, Austin, TX (US)

(73) Assignee: KLA Corporation, Milpitas, CA (US)

( * ) Notice: Subject to any disclaimer, the term of this patent is extended or adjusted under 35 U.S.C. 154(b) by 91 days.

(21) Appl. No.: 17/333,770

(22) Filed: May 28, 2021

(65) Prior Publication Data

US 2022/0359247 A1 Nov. 10, 2022

Related U.S. Application Data

(60) Provisional application No. 63/184,793, filed on May 6, 2021.

(51) Int. Cl.
*H01L 21/67* (2006.01)
*G05B 19/418* (2006.01)
*G01R 31/26* (2020.01)

(52) U.S. Cl.
CPC .... *H01L 21/67288* (2013.01); *G01R 31/2601* (2013.01); *G05B 19/41875* (2013.01); *G05B 2219/45031* (2013.01)

(58) Field of Classification Search
None
See application file for complete search history.

(56) References Cited

U.S. PATENT DOCUMENTS 7,739,064 B1 6/2010 Ryker et al.
8,711,346 B2 4/2014 Stokowski
(Continued)

FOREIGN PATENT DOCUMENTS

KR 20190123792 A 11/2019

OTHER PUBLICATIONS

International Search Report and Written Opinion in Application No. PCT/US2022/026850 dated Aug. 18, 2022, 6 pages.

*Primary Examiner* — Patrick Assouad
*Assistant Examiner* — Haidong Zhang
(74) *Attorney, Agent, or Firm* — Suiter Swantz pc llo (57) ABSTRACT

Systems and methods for semiconductor adaptive testing using inline defect part average testing are configured to receive a plurality of inline defect part average testing (I-PAT) scores from an I-PAT system, where the plurality of I-PAT scores is generated by the I-PAT system based on semiconductor die data for a plurality of semiconductor dies, where the semiconductor die data includes characterization measurements for the plurality of semiconductor dies, where each I-PAT score of the plurality of I-PAT scores represents a weighted defectivity determined by the I-PAT system based on a characterization measurement of a corresponding semiconductor die of the plurality of semiconductor dies; apply one or more rules to the plurality of I-PAT scores during a dynamic decision-making process; and generate one or more adaptive tests for at least one semiconductor die of the plurality of semiconductor dies based on the dynamic decision-making process.

25 Claims, 6 Drawing Sheets

(56) References Cited

U.S. PATENT DOCUMENTS

| | | |
|---|---|---|
| 10,761,128 B2 | 9/2020 | Price et al. |
| 2007/0212798 A1* | 9/2007 | Deshmukh ........ H01L 21/67288 |
| | | 438/5 |
| 2013/0007546 A1 | 1/2013 | Grady et al. |
| 2017/0343601 A1 | 11/2017 | Casatuta et al. |
| 2018/0275189 A1* | 9/2018 | Price ...................... G06F 17/18 |
| 2019/0295908 A1 | 9/2019 | Rathert et al. |

* cited by examiner

SYSTEMS AND METHODS FOR SEMICONDUCTOR ADAPTIVE TESTING USING INLINE DEFECT PART AVERAGE TESTING

CROSS-REFERENCE TO RELATED APPLICATION

The present application claims the benefit of U.S. Provisional Application Ser. No. 63/184,793, filed on May 6, 2021, which is incorporated herein by reference in the entirety.

TECHNICAL FIELD

The present disclosure relates generally to semiconductor devices and, more particularly, to systems and methods for semiconductor adaptive testing using inline defect part average testing.

BACKGROUND

Fabrication of semiconductor devices may typically require hundreds or thousands of processing steps to form a functioning device. Over the course of these processing steps, various characterization measurements (e.g., inspection and/or metrology measurements) may be performed to identify defects and/or monitor various parameters on the devices. Electrical testing may be performed instead of or in addition to the various characterization measurements to verify or assess the functionality of the device. However, while some detected defects and metrology errors may be so significant as to clearly indicate a device failure, lesser variations may cause early reliability failures of the device after exposure to a working environment. Risk-averse users of semiconductor devices (e.g., such as automotive, military, aeronautical and medical applications) are now looking for failure rates in the parts-per-billion (PPB) range, exceeding current parts-per-million (PPM) levels. Evaluating the reliability of semiconductor dies is key to meeting these industry requirements as the need for semiconductor devices in automotive, military, aeronautical, and medical applications continues to increase.

SUMMARY

A system is disclosed, in accordance with one or more embodiments of the present disclosure. In one illustrative embodiment, the system includes an adaptive test controller communicatively coupled to an inline defect part average testing (I-PAT) system. In another illustrative embodiment, the adaptive test controller includes one or more processors and memory. In another illustrative embodiment, the memory is configured to store a set of program instructions. In another illustrative embodiment, the one or more processors are configured to execute program instructions causing the one or more processors to receive a plurality of I-PAT scores from the I-PAT system. In another illustrative embodiment, the plurality of I-PAT scores is generated by the I-PAT system based on semiconductor die data for a plurality of semiconductor dies. In another illustrative embodiment, the semiconductor die data includes characterization measurements for the plurality of semiconductor dies. In another illustrative embodiment, each I-PAT score of the plurality of I-PAT scores represents a weighted defectivity determined by the I-PAT system based on a characterization measurement of a corresponding semiconductor die of the plurality of semiconductor dies. In another illustrative embodiment, the one or more processors are configured to execute program instructions causing the one or more processors to apply one or more rules to the plurality of I-PAT scores during a dynamic decision-making process. In another illustrative embodiment, the one or more processors are configured to execute program instructions causing the one or more processors to generate one or more adaptive tests for at least one semiconductor die of the plurality of semiconductor dies based on the dynamic decision-making process.

A method is disclosed, in accordance with one or more embodiments of the present disclosure. In one illustrative embodiment, the method may include, but is not limited to, receiving, via an adaptive test controller, a plurality of inline defect part average testing (I-PAT) scores from an I-PAT system. In another illustrative embodiment, the plurality of I-PAT scores is generated by the I-PAT system based on semiconductor die data for a plurality of semiconductor dies. In another illustrative embodiment, the semiconductor die data includes characterization measurements for the plurality of semiconductor dies. In another illustrative embodiment, each I-PAT score of the plurality of I-PAT scores represents a weighted defectivity determined by the I-PAT system based on a characterization measurement of a corresponding semiconductor die of the plurality of semiconductor dies. In another illustrative embodiment, the method may include, but is not limited to, applying, via the adaptive test controller, one or more rules to the plurality of I-PAT scores during a dynamic decision-making process. In another illustrative embodiment, the method may include, but is not limited to, generating, via the adaptive test controller, one or more adaptive tests for at least one semiconductor die of the plurality of semiconductor dies based on the dynamic decision-making process.

A system is disclosed, in accordance with one or more embodiments of the present disclosure. In one illustrative embodiment, the system includes an inline defect part average testing (I-PAT) system. In another illustrative embodiment, the I-PAT system is configured to receive semiconductor die data for a plurality of semiconductor dies and generate a plurality of I-PAT scores based on the semiconductor die data. In another illustrative embodiment, the semiconductor die data includes characterization measurements for the plurality of semiconductor dies. In another illustrative embodiment, each I-PAT score of the plurality of I-PAT scores represents a weighted defectivity determined by the I-PAT system based on a characterization measurement of a corresponding semiconductor die of the plurality of semiconductor dies. In another illustrative embodiment, the system includes an adaptive test controller communicatively coupled to the I-PAT system. In another illustrative embodiment, the adaptive test controller includes one or more processors and memory. In another illustrative embodiment, the memory is configured to store a set of program instructions. In another illustrative embodiment, the one or more processors are configured to execute program instructions causing the one or more processors to receive the plurality of I-PAT scores from the I-PAT system. In another illustrative embodiment, the one or more processors are configured to execute program instructions causing the one or more processors to apply one or more rules to the plurality of I-PAT scores during a dynamic decision-making process. In another illustrative embodiment, the one or more processors are configured to execute program instructions causing the one or more processors to generate one or more adaptive tests for at least one semiconductor die of the plurality of semiconductor dies based on the dynamic decision-making process.

It is to be understood that both the foregoing general description and the following detailed description are exemplary and explanatory only and are not necessarily restrictive of the invention as claimed. The accompanying drawings, which are incorporated in and constitute a part of the specification, illustrative embodiments of the invention and together with the general description, serve to explain the principles of the invention.

BRIEF DESCRIPTION OF DRAWINGS

The numerous advantages of the disclosure may be better understood by those skilled in the art by reference to the accompanying figures in which.

DETAILED DESCRIPTION

Reference will now be made in detail to the subject matter disclosed, which is illustrated in the accompanying drawings. The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Fabrication of semiconductor devices may typically require hundreds or thousands of processing steps to form a functioning device. Over the course of these processing steps, various characterization measurements (e.g., inspection and/or metrology measurements) may be performed to identify defects and/or monitor various parameters on the devices. Electrical testing may be performed instead of or in addition to the various characterization measurements to verify or assess the functionality of the device.

However, while some detected defects and metrology errors may be so significant as to clearly indicate a device failure, lesser variations may cause early reliability failures of the device after exposure to a working environment. Defects arising during the manufacturing process may have a wide range of impacts on the performance of the device in the field. For example, "killer" defects occurring in known or unknown locations within designs may result in immediate device failure. For instance, killer defects in unknown locations may be particularly problematic where they have a susceptibility to reliability escapes in test gaps, where a semiconductor device may be functionally dead after processing but the device maker is unable to make this determination due to limitations in testing. By way of another example, minor defects may have little or no impact on the performance of the device throughout the device lifetime. By way of another example, a class of defects known as latent reliability defects (LRD) may not lead to failure during manufacturing/testing or may not lead to immediate device failure during operation, but may lead to early-life failure of the device during operation when used in a working environment. It is noted herein the terms "manufacturing process" and "fabrication process" may be considered equivalent, along with respective variants of the terms (e.g., "manufacturing line" and "fabrication line", and the like), for purposes of the present disclosure.

Risk-averse users of semiconductor devices (e.g., such as automotive, military, aeronautical and medical applications) are now looking for failure rates in the parts-per-billion (PPB) range, exceeding current parts-per-million (PPM) levels. Evaluating the reliability of semiconductor dies is key to meeting these industry requirements as the need for semiconductor devices in automotive, military, aeronautical, and medical applications continues to increase.

In one example, semiconductor devices in quality critical roles may undergo extensive electrical testing, both during wafer sort and again at final test after singulation and packaging. This phase of production is under conflicting pressures to both reduce quality escapes and lower costs by shortening test times. One way to serve both goals is with adaptive testing, where the variables of the test program for each device under test are adjusted dynamically using a variety of a priori information sources. The output or results of adaptive testing may change one or more of test conditions, manufacturing flow, test content, or test limits or disposition of die after the adaptive testing.

Known adaptive testing techniques rely solely on preliminary electrical data from wafer sort or statistical prediction of electrical test trends and yield results from previous lots and neighboring die to dynamically shape the test program. The resultant inline process control information is too sparse to be used to shape test at an individual device level, however, as sampling encompassed only 1-2% of production material. In addition, the known adaptive testing techniques lack die-level manufacturing defect and/or metrology information that assists risk prediction. Further, relying only on electrical wafer sort data may overlook the potential presence of LRD in shaping adaptive tests, as un-activated LRD are invisible to electrical testing. Further, statistical-based predictive algorithms lack provenance data about the semiconductor die undergoing testing, and may miss individual outliers caused by a localized manufacturing deviation. Further, predictive algorithms based on historical feedback loops that pare a test set to only electrical tests may fail to overlook the unpredictable nature of manufacturing process excursions and the unexpected failures they can create. These shortcomings are especially problematic in a PPB testing environment, as they may create unacceptable risk.

Embodiments of the present disclosure are directed to systems and methods for semiconductor adaptive testing using inline defect part average testing (I-PAT). Embodiments of the present disclosure are also directed to using inline defect screening, or I-PAT, along with semiconductor characterization processes to identify semiconductor die outliers. Embodiments of the present disclosure also include assessing the suitability of a particular adaptive test for a given semiconductor die. Embodiments of the present disclosure also include assessing the suitability of particular adaptive test parameters for a given semiconductor die.

Figure 1:
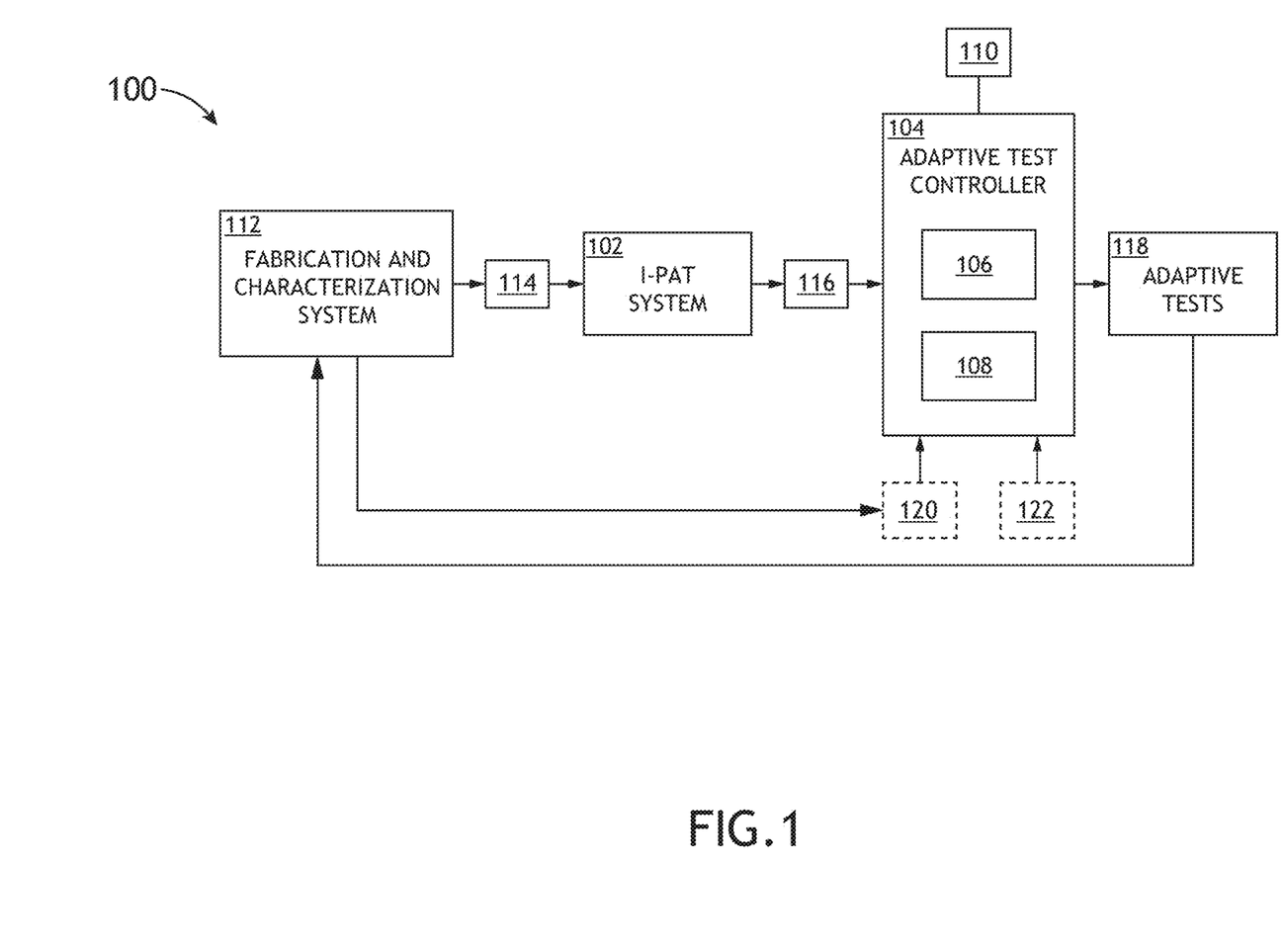
FIG. 1 is a block diagram view of a system for semiconductor adaptive testing using inline defect part average testing (I-PAT), in accordance with one or more embodiments of the present disclosure.
Figure 2:
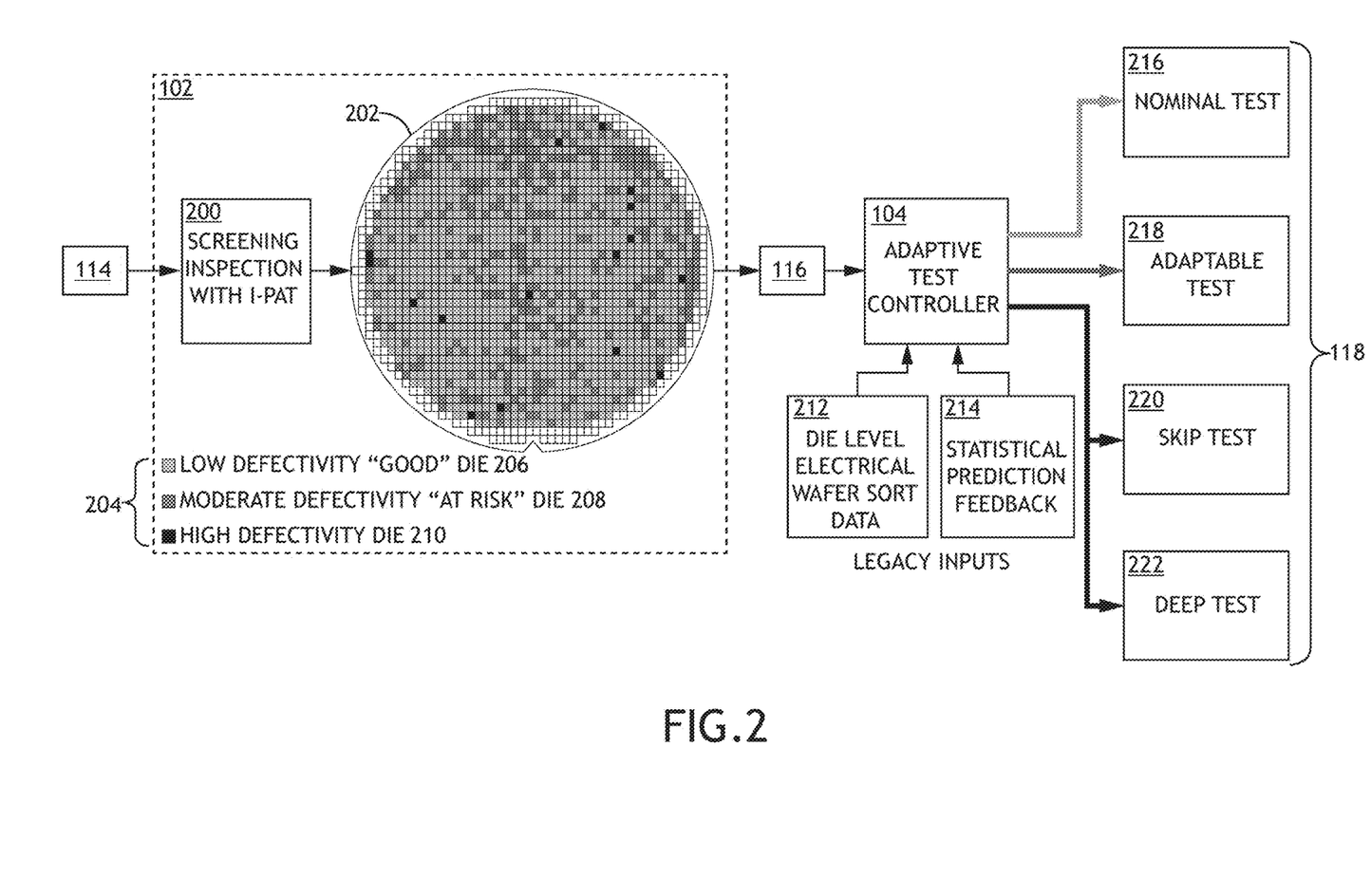
FIG. 2 is a conceptual illustration of a system for semiconductor adaptive testing using I-PAT, in accordance with one or more embodiments of the present disclosure.

FIGS. 1 and 2 in general illustrate block diagram views of a system 100 for semiconductor adaptive testing using inline defect part average testing (I-PAT), in accordance with one or more embodiments of the present disclosure.

In some embodiments, the system 100 includes an I-PAT system 102 and an adaptive test controller 104 (or adaptive test server 104). The adaptive test controller 104 may include one or more processors 106 configured to execute program instructions maintained on or stored in memory 108 (e.g., a memory medium, memory device, or the like). It is noted herein the one or more processors 106 of the adaptive test controller 104 may execute any of the various process steps described throughout the present disclosure. For example, the one or more processors 106 may be configured to receive semiconductor die data, generate I-PAT scores about semiconductor dies from the semiconductor die data with the I-PAT system 102, generate adaptive tests for at least some of the semiconductor dies based on the I-PAT scores from the I-PAT system 102, and determine adjustments based on the adaptive tests.

The system 100 may include a user interface 110 coupled (e.g., physically coupled, electrically coupled, communicatively coupled, or the like) to the adaptive test controller 104. For example, the user interface 110 may be a separate device coupled to the adaptive test controller 104. By way of another example, the user interface 110 and the adaptive test controller 104 may be located within a common or shared housing. It is noted herein, however, the adaptive test controller 104 may not include, require, or be coupled to the user interface 110.

In some embodiments, the system 100 includes a semiconductor fabrication and characterization system 112 coupled (e.g., physically coupled, electrically coupled, communicatively coupled, or the like) to the I-PAT system 102. The semiconductor fabrication and characterization system 112 may transmit semiconductor data 114, which may be received by the I-PAT system 102. For example, the semiconductor data 114 may be transmitted directly between the semiconductor fabrication and characterization system 112 and the I-PAT system 102. By way of another example, the semiconductor data 114 may be transmitted between the semiconductor fabrication and characterization system 112 and the I-PAT system 102 via one or more auxiliary controllers or servers. As such, examples of systems, subsystems, or controllers or servers described throughout the present disclosure are provided solely for illustrative purposes and should not be interpreted as limiting.

The semiconductor data 114 may be uploaded to the I-PAT system 102 as a standardized data format shared by the semiconductor fabrication and characterization system 112 and the I-PAT system 102. For example, the standardized data format may be formatted for use with different operating systems including, but not limited to, Android, Apple iOS, Microsoft Windows, Apple macOS, Linux, ChromeOS, Unix, Ubuntu, or the like. It is noted herein, however, the fabrication environment may use a first type of file format, while the I-PAT environment may use a different type of file format.

As such, the semiconductor data 114 may be a non-standardized fabrication data format requiring conversion. For example, the semiconductor fabrication and characterization system 112 may transmit the semiconductor data 114 in the non-standardized fabrication data format to the I-PAT system 102, and the I-PAT system 102 may convert the semiconductor data 114 into a standardized testing data format following receipt. By way of another example, the semiconductor fabrication and characterization system 112 may convert the semiconductor data 114 into a standardized testing data format prior to transmission to the I-PAT system 102. In addition, the semiconductor data 114 may be uploaded to the I-PAT system 102 as a proprietary data format special to the fabrication environment and/or the testing environment. Further, the semiconductor data 114 may be shared using encrypted data (e.g., via daemons), web or cloud interfaces, or other secure connections using die traceability to ensure the semiconductor data 114 stays synchronized.

The I-PAT system 102 may receive the semiconductor data 114 and perform one or more screening inspection processes 200 on the semiconductor data 114. The semiconductor data 114 may include information about a semiconductor wafer 202 of a plurality of semiconductor wafers 202, wafers, where each semiconductor wafer 202 of the plurality of semiconductor wafers 202 includes a plurality (e.g., 1, 2, . . . N number) of layers fabricated following a number (e.g., tens, hundreds, thousands) of steps performed by a number of fabrication processes, where each layer of the plurality of layers includes a plurality of semiconductor dies 204, where each semiconductor die 204 of the plurality of semiconductor dies 204 includes a plurality of blocks. In this regard, the semiconductor data 114 may include wafer-level data, layer-level data, die-level data, and/or block-level data. For purposes of the present disclosure, "semiconductor data" should be understood as including "semiconductor die data", such that "semiconductor data" and "semiconductor die data" may be considered equivalent. However, it is noted herein that "semiconductor data" is not intended to be limited to including only "semiconductor die data".

The one or more screening inspection processes 200 may characterize the plurality of semiconductor dies 204. For example, each semiconductor die 204 of the plurality of semiconductor dies 204 may be characterized as either a low defectivity "good" semiconductor die 206, a moderate defectivity "at risk" semiconductor die 208, or a high defectivity semiconductor die 210.

It is noted herein the characterization of the plurality of semiconductor dies 204 may occur for all (e.g., 100%) or a subset of the plurality of semiconductor dies 204 on a particular semiconductor wafer 202. In addition, it is noted herein the characterization of the plurality of semiconductor dies 204 may occur for all (e.g., 100%) or a subset of the plurality of semiconductor layers on a particular semiconductor wafer 202. For example, the subset of the plurality of semiconductor layers may include, but are not limited to, one or more layers determined to be wholly critical and/or include critical aspects. Further, it is noted herein the characterization of the plurality of semiconductor dies 204 may occur for all (e.g., 100%) or a subset of the plurality of semiconductor wafers 202.

With I-PAT scores potentially available for 100% of wafers and 100% of die, significant information about the relative health or quality risk of each die is usable and could be employed by test engineers to adaptively shape their test programs. With the addition of I-PAT data, adaptive testing may dynamically customize test content with low latency to reduce escapes, while simultaneously reducing the total cost of testing. In addition, with the addition of I-PAT data, the test adaptation may differ for each die, potentially resulting in adjusted test time, different test content, or different test limits for each semiconductor device under test. Example uses of I-PAT methodologies include U.S. Pat. No. 10,761,128, issued on Sep. 1, 2020, and U.S. patent application Ser. No. 17/101,856, filed on Nov. 23, 2020, which are each incorporated herein in the entirety.

In some embodiments, the I-PAT system 102 outputs a weighted, aggregate score 116, or I-PAT score 116, to the adaptive test controller 104. The I-PAT score 116 may represent the quantity and risk level of defects present in each semiconductor die 204 summed across each of the layers being inspection screened, such that the I-PAT score 116 is a die-level score. The I-PAT score 116 may include the layer(s) at which the defect(s) occurred, including information about the x, y position within the semiconductor die(s) 204. The I-PAT score 116 may describe the type of defect (e.g., short, open, or the like), size of the defect, inclusion in a cluster, or position (e.g., x, y position) on the wafer 202.

The weighted aggregate score 116 may be binned with one or more pre-set outlier thresholds or custom user-defined outlier thresholds prior to being outputted to the adaptive test controller 104. It is noted herein, however, the weighted aggregate score 116 may be outputted to the adaptive test controller 104 in an organizational form similar to that of the semiconductor die data 114.

The I-PAT score 116 may be outputted to the adaptive test controller 104 either directly or indirectly via one or more auxiliary servers or controllers. As such, examples of systems, subsystems, or controllers or servers described throughout the present disclosure are provided solely for illustrative purposes and should not be interpreted as limiting.

The I-PAT score 116 may be uploaded to the adaptive test controller 104 as a standardized data format shared by the I-PAT system 102 and the adaptive test controller 104. For example, the standardized data format may be formatted for use with different operating systems including, but not limited to, Android, Apple iOS, Microsoft Windows, Apple macOS, Linux, ChromeOS, Unix, Ubuntu, or the like. It is noted herein, however, the fabrication environment (including the I-PAT environment) may use a first type of file format (e.g., defect data formats and KLARF file formats), while the testing environment may use a different type of file format (e.g., STDF file formats, BITdb file formats, or the like).

As such, the I-PAT score 116 may be a non-standardized fabrication data format requiring conversion. For example, the I-PAT system 102 may transmit the I-PAT score 116 in the non-standardized fabrication data format to the adaptive test controller 104, and the adaptive test controller 104 may convert the I-PAT score 116 into a standardized testing data format following receipt. By way of another example, the I-PAT system 102 may convert the I-PAT score 116 into a standardized testing data format prior to transmission to the adaptive test controller 104. In addition, the I-PAT score 116 may be uploaded to the adaptive test controller 104 as a proprietary data format special to the fabrication environment and/or the testing environment. Further, the I-PAT score 116 may be shared using encrypted data (e.g., via daemons), web or cloud interfaces, or other secure connections using die traceability to ensure the I-PAT score 116 for each semiconductor die 204 stays synchronized.

It is noted herein the distinctions of operating with "standardized data formats" and/or "non-standardized data formats" with respect to the I-PAT system 102, the adaptive test controller 104, and/or the semiconductor fabrication and characterization system 112 is provided solely for illustrative purposes and should not be interpreted as limiting.

In some embodiments, the adaptive test controller 104 generates one or more adaptive tests 118 from the I-PAT score 116, instead of using the I-PAT score 116 to make decisions about immediately culling highly defective die, and/or merging the I-PAT score 116 with electrical Part Average Testing data to make better informed go/no-go decisions for semiconductor dies 204 following final electrical tests.

Using a set of user-defined rules or pre-set rules for limits on the I-PAT score 116 (and/or the contributory elements for the I-PAT score 116), the adaptive test controller 104 may use dynamic rule-based decision-making processes on the I-PAT score 116 for each semiconductor die 204. For example, the dynamic rule-based decision-making processes may be used to make decisions on the content, duration and limits for test patterns run on each device under test depending on the quantity, type, location or layer of defects present. It is noted herein the "dynamic" nature of the decision-making may be attributed to one or more of the receiving of the user-defined rules and subsequent adjusting of the decision-making processes, the continuous operation of the decision-making processes as the I-PAT scores 116 are received, and/or the constant changing of the adaptive tests 118 based on the application of the defined rules to generate the one or more adaptive tests 118.

The adaptive test controller 104 may use dynamic rule-based decision-making on the I-PAT score 116 for each semiconductor die 204 by itself, or may combine the dynamic rule-based decision-making with other processes.

For example, the decision-making may receive die level electrical sort data 212 from electrical sort processes 120. For instance, the electrical sort data 212 may include, but is not limited to, wafer probe data or other electrical test data received from the semiconductor fabrication and characterization system 112 during or following processes to electrically evaluate the device functionality at the conclusion of a fabrication manufacturing process (e.g., electrical wafer sort (EWS) processes, or the like).

By way of another example, the decision-making may receive statistical prediction feedbacks 214 from statistical prediction processes 122. For example, the statistical prediction feedbacks 214 may be in the form of data sets or tables, graphs, models, or other form of physical or graphical display.

It is noted herein the dynamic rule-based decision-making, the electrical sort processes 120, and/or the statistical prediction processes 122 may be combined. For example, the combination may be based on a user-defined order of precedence (e.g., a weighting factor) to be taken into consideration when determining the type of the one or more adaptive tests 118.

The one or more adaptive tests 118 may include one or more of the following non-limiting examples. For example, the one or more adaptive tests 118 may be selected based on a threshold between the low defectivity "good" semiconductor die 206 and the moderate defectivity "at risk" semiconductor die 208, and/or based on a second threshold between the moderate defectivity "at risk" semiconductor die 208 and the high defectivity semiconductor die 210.

In one non-limiting example, the one or more adaptive tests 118 may include a nominal test 216. The nominal test 216 may be selected for the low defectivity "good" semiconductor die 206. The nominal test 216 may include a baseline test program, where the baseline test program is at an optimized minimum (e.g., the optimized minimum being when no changes to any of the test parameters would improve the operation of the baseline test program). It is noted herein, however, the nominal test 216 may be a test program that has been reduced from a baseline test program, where the baseline test program is not optimized, through iterative processes until optimization is achieved. For example, the nominal test 216 may be reduced in terms of number and/or types of test vectors, amount of coverage, or the like throughout iterative processes until optimization is achieved. As such, the low defectivity "good" semiconductor die 206 with low I-PAT scores 116 may be assigned nominal testing, saving time and cost.

In another non-limiting example, the one or more adaptive tests 118 may include an adaptable test 218. The adaptable test 218 may be selected for moderate defectivity "at risk" semiconductor die 208. The adaptable test 218 may include changes to a baseline test program including additions of test program parameters to target known defects. For example, the changes may include, but are not limited to, expanding test coverage, adding or adjusting fault models, modifying control limits, dispositioning the moderate defectivity "at risk" semiconductor die 208 with a different binning process, or the like. As such, moderate defectivity "at risk" semiconductor die 208 with I-PAT scores indicating elevated risk may be assigned an "adapted" or "adaptable" test program with additional thoroughness to determine its fitness for purpose, improving quality of results.

In another non-limiting example, the one or more adaptive tests 118 may include a skip test 220. The skip test 220 may generate cost savings by not packaging and/or testing known outlier high defectivity semiconductor die 210, as determined by the I-PAT system 102. Here, the skip test 220 may run a reduced set of test patterns that does not test a non-selected set by recognizing the non-selected set as known outliers, such that the non-selected set is in effect treated similarly to being culled or inked out. As such, high defectivity semiconductor die 210 with very high I-PAT scores 116 may be rejected and therefore skip testing altogether, which may also result in cost savings.

In another non-limiting example, the one or more adaptive tests 118 may include a deep test 222. The deep test 222 may be applied to high defectivity semiconductor die 210 that are potential candidates for a thorough or complete characterization of fault detection and coverage. As such, high defectivity semiconductor die 210 with I-PAT scores containing a targeted defect of interest may trigger employment of a unique set of test vectors known to best recognize a fault when that defect type is present. In addition, high defectivity semiconductor die 210 with I-PAT scores indicating an excursion or new defect type may trigger an extremely thorough test program which characterizes the impact of the defects and the appropriate test vectors for efficient coverage.

It is noted herein the above non-limiting examples are provided solely for illustrative purposes of types of adaptive tests 118, and should not be interpreted as limiting.

Although the I-PAT system 102 and the adaptive test controller 104 are illustrated as separate components of the system 100, it is noted herein the I-PAT system 102 and the adaptive test controller 104 may be integrated together. For example, the I-PAT system 102 may be integrated into the adaptive test controller 104 (e.g., be processes coded to operate on the adaptive test controller 104), such that the adaptive test controller 104 receives the semiconductor die data 114 from the semiconductor fabrication and characterization system 112. By way of another example, the adaptive test controller 104 may be integrated into the I-PAT system 102 (e.g., be processes coded to operate on the I-PAT systems 102), such that the I-PAT system 102 may generate the one or more adaptive tests 118.

Figure 3:
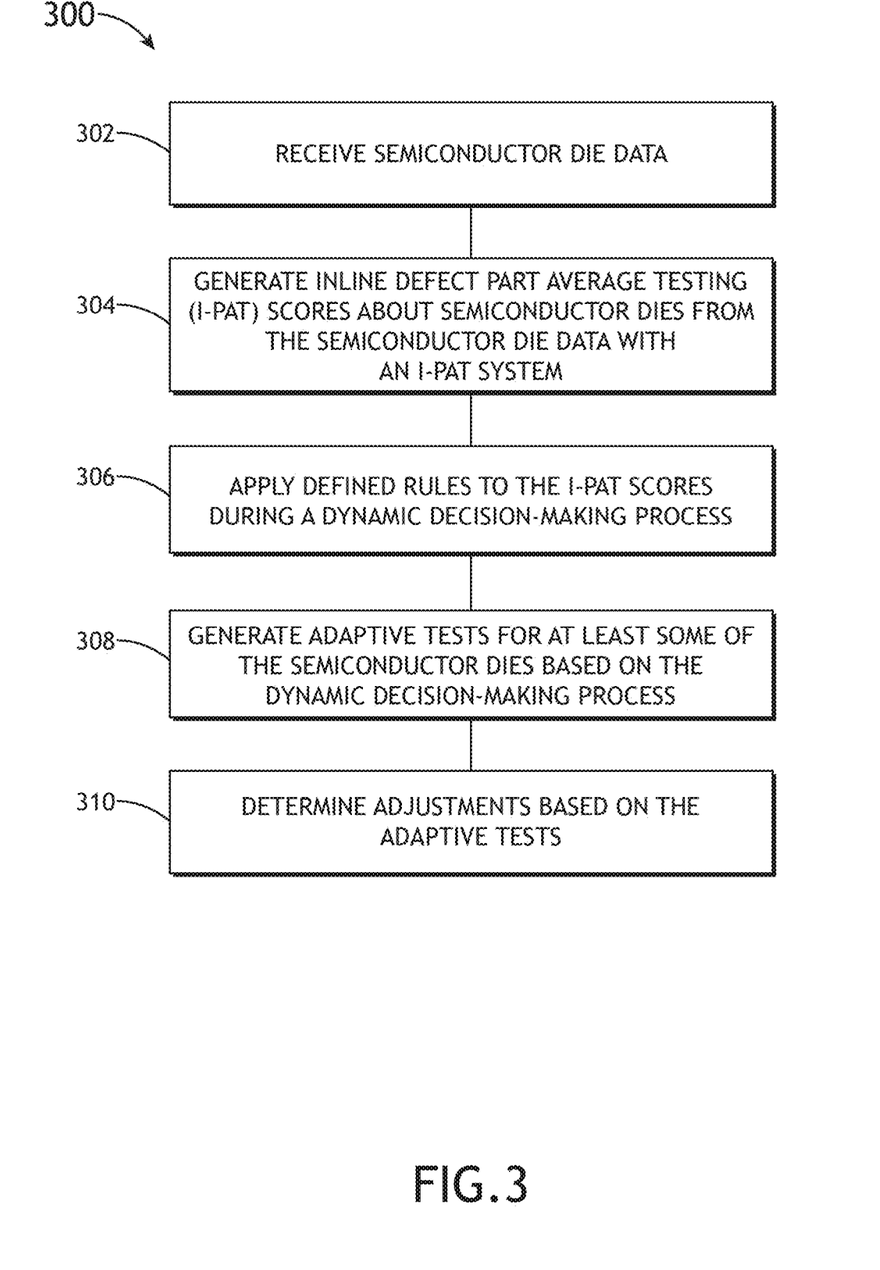
FIG. 3 is a flow diagram illustrating steps performed in a method for semiconductor adaptive testing using I-PAT, in accordance with one or more embodiments of the present disclosure.

FIG. 3 illustrates a method or process 300 for semiconductor adaptive testing using inline defect part average testing, in accordance with one or more embodiments of the present disclosure. It is noted herein that the steps of method or process 300 may be implemented all or in part by the system 100 illustrated in FIGS. 1 and 2. It is further recognized, however, that the method or process 300 is not limited to the system 100 illustrated in FIGS. 1 and 2 in that additional or alternative system-level embodiments may carry out all or part of the steps of method or process 300.

In a step 302, semiconductor die data 114 is received. In some embodiments, the semiconductor die data 114 is received by the I-PAT system 102 from the semiconductor fabrication and characterization system 112.

In a step 304, I-PAT scores 116 are generated about semiconductor dies 204 from the semiconductor die data 114 with the I-PAT system 102. In some embodiments, the I-PAT scores 116 separate semiconductor dies 204 into the low defectivity "good" semiconductor dies 206, the moderate defectivity "at risk" semiconductor dies 208, or the high defectivity semiconductor dies 210.

In a step 306, defined rules are applied during a dynamic decision-making process to the I-PAT scores 116. The defined rules may be user-defined and received by the adaptive test controller 104 (e.g., via the user interface 110). The defined rules may be pre-set within the adaptive test controller 104. The defined rules may separate the semiconductor dies 204 based on the corresponding I-PAT scores 116 and/or observed defects on the semiconductor dies 204.

In a step 308, adaptive tests 118 for at least some of the semiconductor dies 204 are generated based on the dynamic decision-making process. In some embodiments, the adaptive tests 118 include, but are not limited to, the nominal test 216, the adaptable test 218, the skip test 220, and/or the deep test 222.

In a step 310, adjustments are determined based on the adaptive tests 118. In some embodiments, the adjustments are transmitted to the fabrication or characterization system 112 to adjust fabrication and/or characterization processes via either a feed forward loop (e.g., to correct current semiconductor devices) or a feedback loop (e.g., to adjust future semiconductor devices). In this regard, the fabrication and/or characterization processes may be improved, leading to a reduction in cost (e.g., in time, money, or the like) for fabricators while maintaining a desired level of quality (e.g., PPB failure rates).

Although embodiments of the present disclosure illustrate the steps of the method or process 300 being performed by the adaptive test controller 104, it is noted herein some or all of the steps of the method or process 300 may be performed by a server or controller communicatively coupled to the adaptive test controller 104. For example, the server or controller may include processors and memory, and other communicatively-coupled components as described throughout the present disclosure.

Figure 4A:
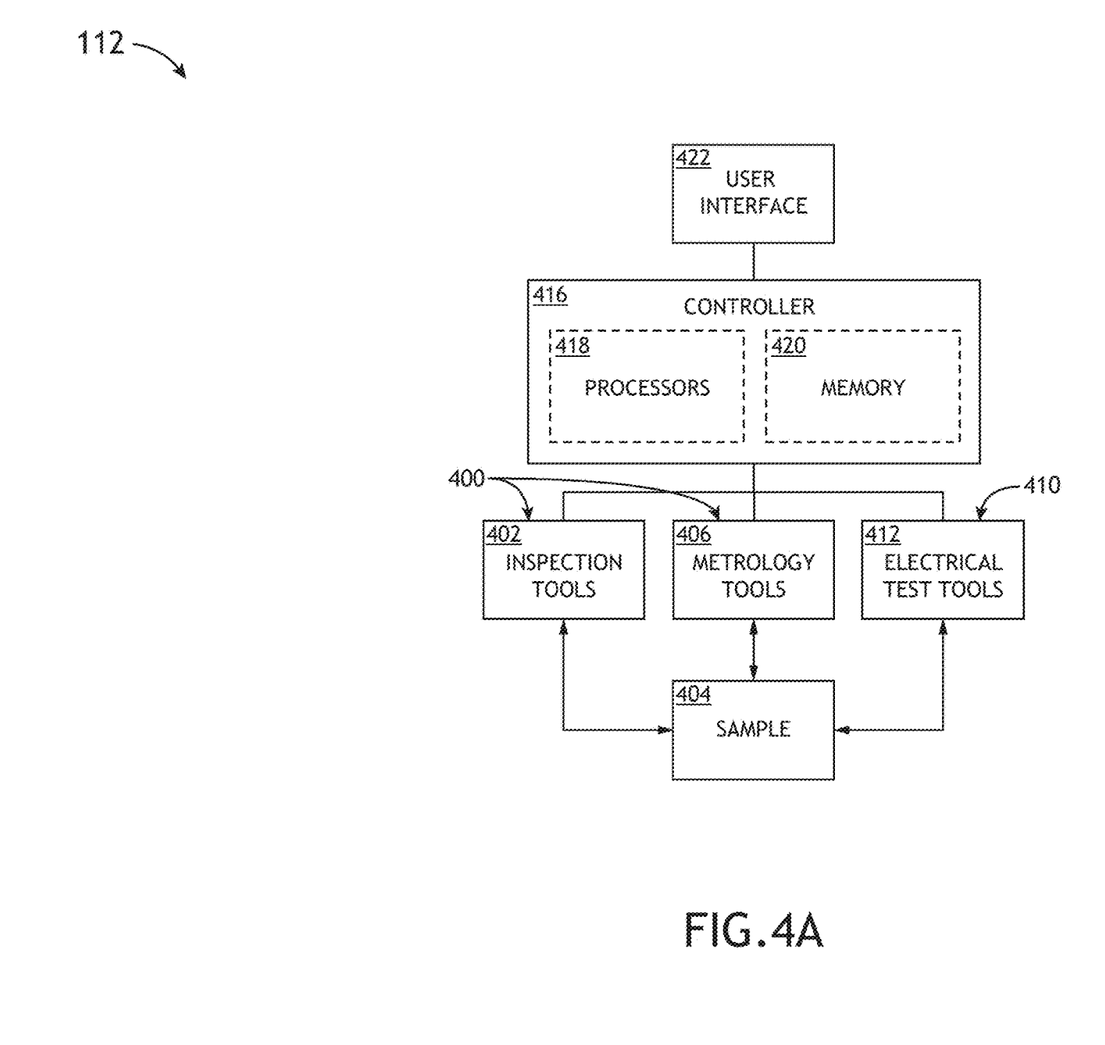
FIG. 4A is a block diagram view of a system for fabricating and characterizing semiconductor devices, in accordance with one or more embodiments of the present disclosure.
Figure 4B:
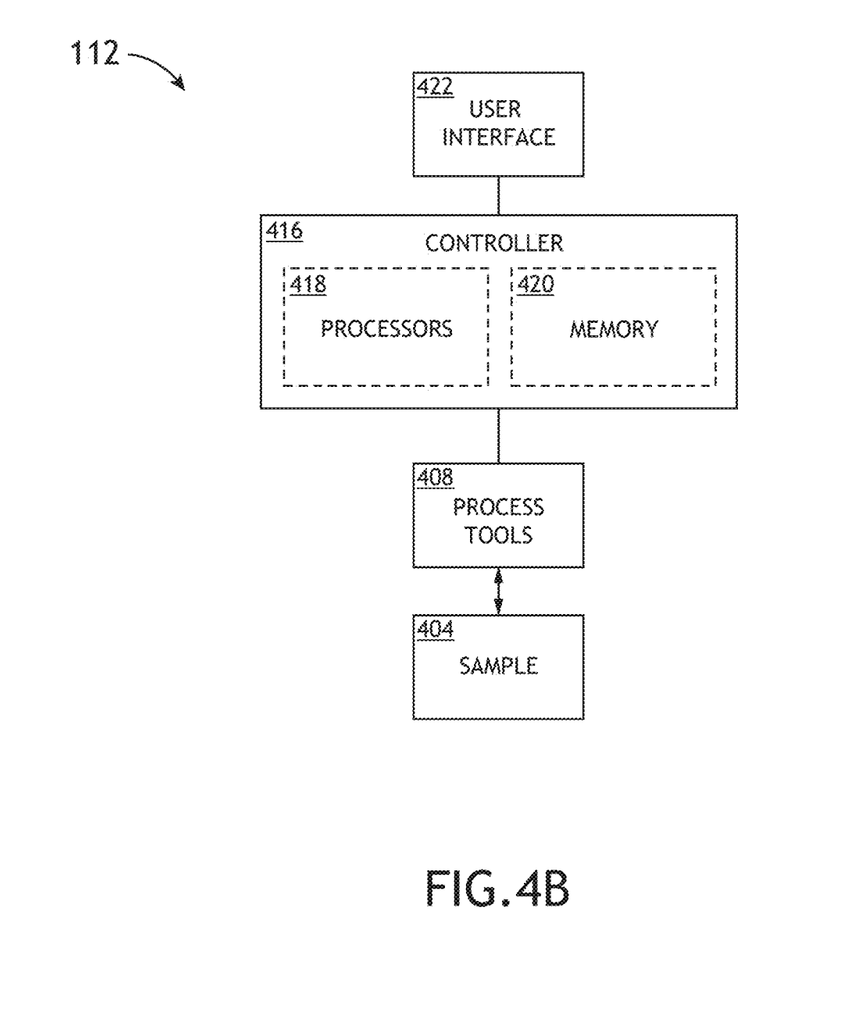
FIG. 4B is a block diagram view of a system for fabricating and characterizing semiconductor devices, in accordance with one or more embodiments of the present disclosure.

FIGS. 4A and 4B illustrate block diagrams of the semiconductor fabrication and characterization system 112, or "system 112", in accordance with one or more embodiments of the present disclosure. It is noted herein the system 112 may be configured to perform processing steps to fabricate and/or analyze semiconductor devices and/or components (e.g., semiconductor dies) on semiconductor devices, as described throughout the present disclosure.

In some embodiments, the system 112 includes one or more semiconductor characterization subsystems 400 configured to output characterization measurements within (or as) semiconductor die data 114 for the semiconductor dies 204. For example, the characterization measurements may include, but are not limited to, baseline inspections (e.g., sampling-based inspections), screening inspections at key semiconductor device layers, or the like. For purposes of the present disclosure, "characterization" may refer to inline defect inspection and/or inline metrology measurements.

In one non-limiting example, the one or more semiconductor characterization subsystems 400 may include at least one inspection tool 402 (e.g., an inline sample analysis tool) for detecting defects in one or more layers of a sample 404 (e.g., the semiconductor wafer 202). The system 112 may generally include any number or type of inspection tools 402. For example, an inspection tool 402 may include an optical inspection tool configured to detect defects based on interrogation of the sample 404 with light from any source such as, but not limited to, a laser source, a lamp source, an X-ray source, or a broadband plasma source. By way of another example, an inspection tool 402 may include a particle-beam inspection tool configured to detect defects based on interrogation of the sample with one or more particle beams such as, but not limited to, an electron beam, an ion beam, or a neutral particle beam. For instance, the inspection tool 402 may include a transmission electron microscope (TEM) or a scanning electron microscope (SEM). For purposes of the present disclosure, it is noted herein the at least one inspection tool 402 may be a single inspection tool 402 or may represent a group of inspection tools 402.

It is noted herein the sample 404 may be a semiconductor wafer of a plurality of semiconductor wafers, where each semiconductor wafer of the plurality of semiconductor wafers includes a plurality (e.g., 1, 2, . . . N number) of layers fabricated following a number (e.g., tens, hundreds, thousands) of steps performed by a number of fabrication processes, where each layer of the plurality of layers includes a plurality of semiconductor dies, where each semiconductor die of the plurality of semiconductor dies includes a plurality of blocks. In addition, it is noted herein the sample 404 may be a semiconductor die package formed from a plurality of semiconductor dies arranged in a 2.5D lateral combination of a bare die on a substrate inside an advanced die package or a 3D die package.

For the purposes of the present disclosure, the term "defect" may refer to a physical defect found by an inline inspection tool, a metrology measurement outlier, or other physical characteristic of the semiconductor device that is deemed to be an anomaly. A defect may be considered to be any deviation of a fabricated layer or a fabricated pattern in a layer from design characteristics including, but not limited to, physical, mechanical, chemical, or optical properties. In addition, a defect may be considered to be any deviation in alignment or joining of components in a fabricated semiconductor die package. Further, a defect may have any size relative to a semiconductor die or features thereon. In this way, a defect may be smaller than a semiconductor die (e.g., on the scale of one or more patterned features) or may be larger than a semiconductor die (e.g., as part of a wafer-scale scratch or pattern). For example, a defect may include deviation of a thickness or composition of a sample layer before or after patterning. By way of another example, a defect may include a deviation of a size, shape, orientation, or position of a patterned feature. By way of another example, a defect may include imperfections associated with lithography and/or etching steps such as, but not limited to, bridges between adjacent structures (or lack thereof), pits, or holes. By way of another example, a defect may include a damaged portion of a sample 404 such as, but not limited to, a scratch, or a chip. For instance, a severity of the defect (e.g., the length of a scratch, the depth of a pit, measured magnitude or polarity of the defect, or the like) may be of importance and taken into consideration. By way of another example, a defect may include a foreign particle introduced to the sample 404. By way of another example, a defect may be a misaligned and/or mis-joined package component on the sample 404. Accordingly, it is to be understood that examples of defects in the present disclosure are provided solely for illustrative purposes and should not be interpreted as limiting.

In another non-limiting example, the one or more semiconductor characterization subsystems 400 may include at least one metrology tool 406 (e.g., an inline sample analysis tool) for measuring one or more properties of the sample 404 or one or more layers thereof. For example, a metrology tool 406 may characterize properties such as, but not limited to, layer thickness, layer composition, critical dimension (CD), overlay, or lithographic processing parameters (e.g., intensity or dose of illumination during a lithographic step). In this regard, a metrology tool 406 may provide information about the fabrication of the sample 404, one or more layers of the sample 404, or one or more semiconductor dies of the sample 404 that may be relevant to the probability of manufacturing defects that may lead to reliability issues for the resulting fabricated devices. For purposes of the present disclosure, it is noted herein the at least one metrology tool 406 may be a single metrology tool 406 or may represent a group of metrology tools 406.

In some embodiments, the system 112 includes at least one semiconductor manufacturing tool or process tool 408. For example, the process tool 408 may include any tool known in the art including, but not limited to, an etcher, scanner, stepper, cleaner, or the like. For instance, a fabrication process may include fabricating multiple dies distributed across the surface of a sample (e.g., a semiconductor wafer, or the like), where each die includes multiple patterned layers of material forming a device component. Each patterned layer may be formed by the process tool 408 via a series of steps including material deposition, lithography, etching to generate a pattern of interest, and/or one or more exposure steps (e.g., performed by a scanner, a stepper, or the like). By way of another example, the process tool 408 may include any tool known in the art configured to package and/or combine semiconductor dies into a 2.5D and/or 3D semiconductor die package. For instance, a fabrication process may include, but is not limited to, aligning semiconductor dies and/or electrical components on the semiconductor dies. In addition, a fabrication process may include, but is not limited to, joining the semiconductor dies and/or the electrical components on the semiconductor dies via hybrid bonding (e.g., die-to-die, die-to-wafer, wafer-to-wafer, or the like) solder, an adhesive, fasteners, or the like. For purposes of the present disclosure, it is noted herein the at least one process tool 408 may be a single process tool 408 or may represent a group of process tools 408. It is noted herein the terms "fabrication process" and "manufacturing process" may be considered equivalent, along with respective variants of the terms (e.g., "fabrication line" and "manufacturing line", "fabricator" and "manufacturer", or the like), for purposes of the present disclosure.

In some embodiments, the system 112 includes the one or more test tool subsystems 410 for testing the functionality of one or more portions of a manufactured device.

In one non-limiting example, the one or more test tool subsystems 410 may include any number or type of electrical test tools 412 to complete a preliminary probing at a wafer level. For example, the preliminary probing may not be designed to try to force a failure at the wafer level.

In some embodiments, defects are identified using any combination of semiconductor characterization subsystems 400 (e.g., inspection tools 402, metrology tools 406, or the like), the test tool subsystems 410 (e.g., including electrical test tools 412 and/or stress test tools 414, or the like), which are utilized before or after one or more processing steps (e.g., lithography, etching, aligning, joining, or the like) performed by one or more process tools 408 for layers of interest in the semiconductor dies and/or semiconductor die packages. In this regard, the defect detection at various stages of the manufacturing process may be referred to as inline defect detection.

In some embodiments, the system 112 includes a controller 416. The controller 416 may include one or more processors 418 configured to execute program instructions maintained on memory 420 (e.g., a memory medium, memory device, or the like). For example, the one or more processors 418 may be configured to acquire semiconductor die data 114 including characterization measurements for semiconductor dies 204, transmit the semiconductor die data 114 to the I-PAT system 102, and generate control signals for adjustments determined based on outputs from adaptive tests for at least some of the semiconductor dies made based on I-PAT scores 116 from the I-PAT system 102.

The controller 416 may be communicatively coupled with any of the components of the system 112 including, but not limited to, semiconductor characterization subsystems 400 including the inspection tools 402 or the metrology tools 406, test tool subsystems 410 including the electrical test tools 412 or the stress test tools 414, or the like. It is noted herein the embodiments illustrated in FIG. 4A and the embodiments illustrated in FIG. 4B may be considered parts of the same fabrication and characterization system 112, or parts of different fabrication and characterization system 112, for purposes of the present disclosure. In addition, it is noted herein components within the semiconductor fabrication and characterization system 112 illustrated in FIG. 4A and components within the semiconductor fabrication and characterization system 112 illustrated in FIG. 4B may be in direct communication or may communicate through the controller 416.

The one or more processors 106 or 418 may include any processor or processing element known in the art. For the purposes of the present disclosure, the term "processor" or "processing element" may be broadly defined to encompass any device having one or more processing or logic elements (e.g., one or more graphics processing units (GPU), micro-processing units (MPU), systems-on-a-chip (SoC), one or more application specific integrated circuit (ASIC) devices, one or more field programmable gate arrays (FPGAs), or one or more digital signal processors (DSPs)). In this sense, the one or more processors 106 or 418 may include any device configured to execute algorithms and/or instructions (e.g., program instructions stored in memory). In one embodiment, the one or more processors 106 or 418 may be embodied as a desktop computer, mainframe computer system, workstation, image computer, parallel processor, networked computer, or any other computer system configured to execute a program configured to operate or operate in conjunction with components of the system 100 or 112, as described throughout the present disclosure.

The memory 108 or 420 may include any storage medium known in the art suitable for storing program instructions executable by the associated respective one or more processors 106 or 418. For example, the memory 108 or 420 may include a non-transitory memory medium. By way of another example, the memory 108 or 420 may include, but is not limited to, a read-only memory (ROM), a random-access memory (RAM), a magnetic or optical memory device (e.g., disk), a magnetic tape, a solid-state drive and the like. It is further noted that the memory 108 or 420 may be housed in a common controller housing with the one or more processors 106 or 418. In one embodiment, the memory 108 or 420 may be located remotely with respect to the physical location of the respective one or more processors 106 or 418. For instance, the respective one or more processors 106 or 418 may access a remote memory (e.g., server), accessible through a network (e.g., internet, intranet, and the like).

In another embodiment, the system 112 includes a user interface 422 coupled (e.g., physically coupled, electrically coupled, communicatively coupled, or the like) to the controller 416. For example, the user interface 422 may be a separate device coupled to the controller 416. By way of another example, the user interface 422 and the controller 416 may be located within a common or shared housing. It is noted herein, however, the controller 416 may not include, require, or be coupled to the user interface 422.

The user interface 110 or 422 may include, but is not limited to, one or more desktops, laptops, tablets, and the like. The user interface 110 or 422 may include a display used to display data of the system 100 or 112 to a user. The display of the user interface 110 or 422 may include any display known in the art. For example, the display may include, but is not limited to, a liquid crystal display (LCD), an organic light-emitting diode (OLED) based display, or a CRT display. Those skilled in the art should recognize that any display device capable of integration with a user interface 110 or 422 is suitable for implementation in the present disclosure. In another embodiment, a user may input selections and/or instructions responsive to data displayed to the user via a user input device of the user interface 110 or 422.

Figure 5:
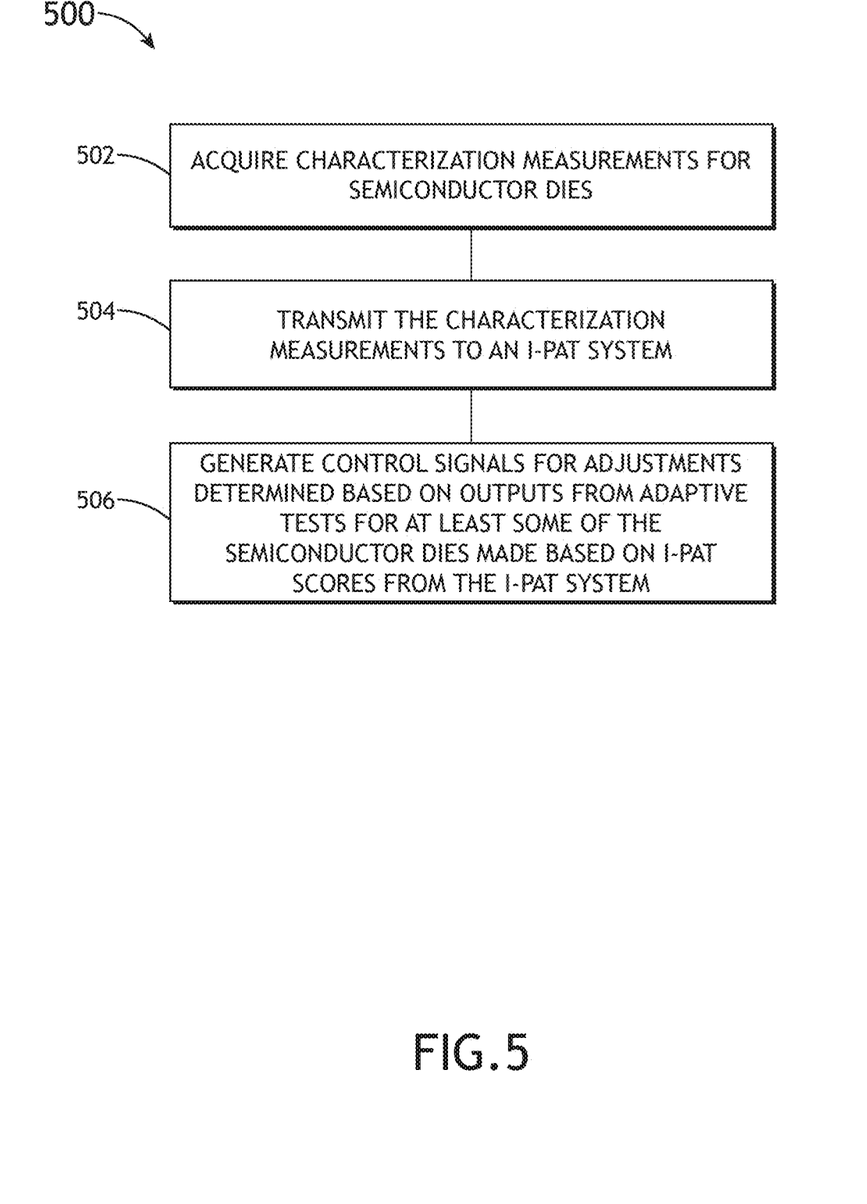
FIG. 5 is a flow diagram illustrating steps performed in a method for fabricating and characterizing semiconductor devices, in accordance with one or more embodiments of the present disclosure.

FIG. 5 illustrates a method or process 500 for semiconductor adaptive testing using inline defect part average testing, in accordance with one or more embodiments of the present disclosure. It is noted herein that the steps of method or process 500 may be implemented all or in part by the system 112 illustrated in FIGS. 4A and 4B. It is further recognized, however, that the method or process 500 is not limited to the system 112 illustrated in FIGS. 4A and 4B in that additional or alternative system-level embodiments may carry out all or part of the steps of method or process 500.

In a step 502, characterization measurements for semiconductor dies 204 are acquired. In some embodiments, the characterization measurements are acquired by the semiconductor fabrication and characterization system 112. It is noted herein the die level electrical sort data 212 may also be acquired either directly or indirectly (e.g., following processing) from the semiconductor fabrication and characterization system 112.

In a step 504, the characterization measurements are transmitted to the I-PAT system 102. In some embodiments, the I-PAT system 102 generates the I-PAT scores 116 based on the characterization measurements. In some embodiments, the adaptive test controller 104 determines one or more adaptive tests 118 based on the I-PAT scores 116.

In a step 506, one or more control signals are generated for adjustments determined based on outputs from adaptive tests 118 for at least some of the semiconductor dies 204 made based on the I-PAT scores 116 from the I-PAT system 102. In some embodiments, the one or more control signals are directed to at least one of the fabricating, characterizing, or testing of the one or more semiconductor devices. For example, the one or more control signals may adjust the semiconductor fabrication and characterization system 112 and/or the one or more fabrication processes or methods or the one or more characterization processes or methods employed by the semiconductor fabrication and characterization system 112, via either a feed forward loop (e.g., to correct current semiconductor devices) or a feedback loop (e.g., to adjust future semiconductor devices).

Although embodiments of the present disclosure illustrate the steps of the method or process 500 being performed by the controller 416, it is noted herein some or all of the steps of the method or process 500 may be performed by a server or controller communicatively coupled to the controller 416. For example, the server or controller may include processors and memory, and other communicatively-coupled components as described throughout the present disclosure.

It is noted herein the methods or processes 300 and 500 are not limited to the steps and/or sub-steps provided. The methods or processes 300 and 500 may include more or fewer steps and/or sub-steps. The methods or processes 300 and 500 may perform the steps and/or sub-steps simultaneously. The methods or processes 300 and 500 may perform the steps and/or sub-steps sequentially, including in the order provided or an order other than provided. Therefore, the above description should not be interpreted as a limitation on the scope of the present disclosure but merely an illustration.

In this regard, unique data from I-PAT screening in the semiconductor fabrication and characterization system 112 can help improve multiple important metrics with significant business impact, can improve tester productivity by enabling reduced test on low defectivity "good" semiconductor die 206 and skipped test on outlier-culled high defectivity semiconductor die 210, can improve quality (with associated benefits to share and pricing) by removing outliers and flagging "at-risk" semiconductor die 208 for adapted tests that more thoroughly evaluates their fitness for purpose, can improve yield by reducing overkill of low defectivity "good" semiconductor die 206, and can improve performance by providing insight into the efficacy of various fault models in detecting inline defects.

Combining I-PAT processes and characterization processes with adaptive testing will allow for a correlated but separate data source to proactively shape test programs and reduce costs while assuring quality of results. For example, a test engineer may be responsible for testing automotive semiconductor devices to meet a requirement for PPB (part per billion) levels of quality. Accomplishing a PPB level of quality may require extensive semiconductor device coverage and multiple overlapping test patterns, resulting in lengthy and expensive test times with some redundancy. Cost pressure to reduce test time makes the use of adaptive tests 118 seem financially attractive; however, incomplete knowledge about a device's quality should wafer sort data and predictive statistical algorithms be the only inputs result in possible exposure to manufacturing excursions, latent defects and localized random failures, makes implementing the adaptive tests 118 a potential risk. In general, it is believed fabrication quality teams will see the benefit to connecting the front-end fabrication with back-end testing as a differentiating capability to show continuous improvement toward PPB goals.

The availability for defect data on 100% of die and 100% of wafers represents an inflection in available source of quality data for decision making. The risk may be mitigated by also feeding I-PAT scores 116 and metrology data forward from fabrication screening inspections into the adaptive test controller 104, allowing customized adaptive test 118 shaping on tangible data from the semiconductor device's manufacturing history.

In a non-limiting example, if the adaptive test controller 104 identifies a defect in the shallow trench module of the semiconductor device, the adaptive test 118 might trigger more leakage testing.

In another non-limiting example, if the adaptive test controller 104 identifies a defect the metal interconnect module of the semiconductor device, the adaptive test 118 might trigger more delay testing.

In another non-limiting example, if the adaptive test controller 104 identifies a series of semiconductor die 206 with very low levels of defectivity, the adaptive test 118 might trigger to begin subsampling test content (e.g., start running a particular test pattern on only one out of every ten die until a failure is observed . . . then go back to 100%), or even skip content to reduce test content.

In another non-limiting example, if the adaptive test controller 104 identifies a short in a difficult-to-test high voltage analog region, the adaptive test 118 might be triggered to perform more testing, expand the parametric testing range, or simply fail that device.

In another non-limiting example, if the adaptive test controller 104 identifies a semiconductor die 204 with a variation in thickness/overlay at the gate level, the adaptive test 118 might trigger additional testing to determine the correct speed bin.

In another non-limiting example, if the adaptive test controller 104 identifies a defect that occurs within a certain proximity to an "N Detect" value of <3, where "N Detect" is the number of times a fault is exercised by different, overlapping test patterns, the adaptive test 118 might trigger additional testing.

In another non-limiting example, if the system identifies a defect that occurs within a certain proximity to an "N Detect" value of >50, where "N Detect" is the number of times a fault is exercised by different, overlapping test patterns, the adaptive test 118 might be instructed to ignore this defect.

It is noted herein the above non-limiting examples are provided solely for illustrative purposes of types of adaptive test 118 and/or modifications to adaptive tests 118, and should not be interpreted as limiting.

Advantages of the present disclosure are directed to systems and methods for semiconductor adaptive testing using inline defect part average testing. Advantages of the present disclosure are also directed to using inline defect screening and/or inline part average testing (I-PAT) along with semiconductor characterization processes to identify semiconductor die outliers. Advantages of the present disclosure are also directed to assessing the suitability of a particular adaptive test program for a given semiconductor die. Advantages of the present disclosure are also directed to assessing the suitability of particular adaptive test parameters for a given semiconductor die.

Notably, advantages of the present disclosure are directed to assessing the suitability of a nominal test program or the need for alternate test programs for a given die. Advantages of the present disclosure are also directed to assessing which test vectors, test patterns, or fault models should apply for a semiconductor device under test. Advantages of the present disclosure are also directed to appending additional test vectors, test patterns, or fault models to a baseline test program. Advantages of the present disclosure are also directed to deciding to skip test of die considered likely to fail to save time and costs. Advantages of the present disclosure are also directed to triggering Continue-on-Fail testing of semiconductor die in need of further characterization due to new defect types. Advantages of the present disclosure are also directed to adjusting test limits for acceptable device performance. Advantages of the present disclosure are also directed to supplementing predictive statistical algorithms and wafer test data in rule-based decision making on test reduction and risk management. Advantages of the present disclosure are also directed to directing additional test vectors, test patterns, or fault models to one or more cores in a multi-core graphics processing unit (GPU), micro-processing unit (MPU), or system-on-a-chip (SoC) that have outlier levels of defectivity.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected" or "coupled" to each other to achieve the desired functionality, and any two components capable of being so associated can also be viewed as being "couplable" to each other to achieve the desired functionality. Specific examples of couplable include but are not limited to physically interactable and/or physically interacting components and/or wirelessly interactable and/or wirelessly interacting components and/or logically interactable and/or logically interacting components.

It is believed that the present disclosure and many of its attendant advantages will be understood by the foregoing description, and it will be apparent that various changes may be made in the form, construction, and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A system comprising:
an adaptive test controller communicatively coupled to an inline defect part average testing (I-PAT) system, wherein the adaptive test controller includes one or more processors and memory, wherein the memory is configured to store a set of program instructions, wherein the one or more processors are configured to execute program instructions causing the one or more processors to:
receive a plurality of I-PAT scores from the I-PAT system, wherein the plurality of I-PAT scores is generated by the I-PAT system based on semiconductor die data for a plurality of semiconductor dies, wherein the semiconductor die data includes characterization measurements for the plurality of semiconductor dies, wherein each I-PAT score of the plurality of I-PAT scores represents a weighted defectivity determined by the I-PAT system based on a characterization measurement of a corresponding semiconductor die of the plurality of semiconductor dies;
apply one or more rules to the plurality of I-PAT scores during a dynamic decision-making process; and
generate one or more adaptive tests for at least one semiconductor die of the plurality of semiconductor dies based on the dynamic decision-making process.

2. The system of claim 1, wherein the one or more processors are further configured to execute program instructions causing the one or more processors to:
determine one or more adjustments to a semiconductor fabrication and characterization system based on the one or more adaptive tests, wherein the semiconductor fabrication and characterization system is configured to acquire the characterization measurements of the semiconductor die data.

3. The system of claim 1, wherein at least one I-PAT score of the plurality of I-PAT scores corresponds to a low defectivity semiconductor die defined by a selected threshold, wherein the one or more adaptive tests comprise an optimized baseline test for the low defectivity semiconductor die.

4. The system of claim 1, wherein at least one I-PAT score of the plurality of I-PAT scores corresponds to a moderate defectivity semiconductor die defined by a selected threshold and a second selected threshold, wherein the one or more adaptive tests includes an adaptable test configured to add one or more test program parameters to a baseline test program for the moderate defectivity semiconductor die, wherein the one or more test program parameters includes at least one of an additional test vector, test pattern, or fault model.

5. The system of claim 1, wherein at least one I-PAT score of the plurality of I-PAT scores corresponds to a high defectivity semiconductor die defined by a second selected threshold, wherein the one or more adaptive tests includes a skip test configured to not test the high defectivity semiconductor die.

6. The system of claim 1, wherein at least one I-PAT score of the plurality of I-PAT scores corresponds to a high defectivity semiconductor die, wherein the one or more adaptive tests includes a test configured to apply a complete characterization of fault detection and coverage to the high defectivity semiconductor die.

7. The system of claim 1, wherein the one or more processors are further configured to execute program instructions causing the one or more processors to:
generate the one or more adaptive tests for the at least one semiconductor die of the plurality of semiconductor dies based on the dynamic decision-making process and at least one of:
die level electrical sort data generated by one or more electrical sort processes; or
statistical prediction feedback generated by one or more statistical prediction processes.

8. A method comprising:
receiving, via an adaptive test controller, a plurality of inline defect part average testing (I-PAT) scores from an I-PAT system, wherein the plurality of I-PAT scores is generated by the I-PAT system based on semiconductor die data for a plurality of semiconductor dies, wherein the semiconductor die data includes characterization measurements for the plurality of semiconductor dies, wherein each I-PAT score of the plurality of I-PAT scores represents a weighted defectivity determined by the I-PAT system based on a characterization measurement of a corresponding semiconductor die of the plurality of semiconductor dies;

applying, via the adaptive test controller, one or more rules to the plurality of I-PAT scores during a dynamic decision-making process; and generating, via the adaptive test controller, one or more adaptive tests for at least one semiconductor die of the plurality of semiconductor dies based on the dynamic decision-making process.

9. The method of claim 8, further comprising:
determining one or more adjustments to a semiconductor fabrication and characterization system based on the one or more adaptive tests, wherein the semiconductor fabrication and characterization system is configured to acquire the characterization measurements of the semiconductor die data.

10. The method of claim 8, wherein at least one I-PAT score of the plurality of I-PAT scores corresponds to a low defectivity semiconductor die defined by a selected threshold, wherein the one or more adaptive tests comprise an optimized baseline test for the low defectivity semiconductor die.

11. The method of claim 8, wherein at least one I-PAT score of the plurality of I-PAT scores corresponds to a moderate defectivity semiconductor die defined by a selected threshold and a second selected threshold, wherein the one or more adaptive tests includes an adaptable test configured to add one or more test program parameters to a baseline test program for the moderate defectivity semiconductor die, wherein the one or more test program parameters includes at least one of an additional test vector, test pattern, or fault model.

12. The method of claim 8, wherein at least one I-PAT score of the plurality of I-PAT scores corresponds to a high defectivity semiconductor die defined by a second selected threshold, wherein the one or more adaptive tests includes a skip test configured to not test the high defectivity semiconductor die.

13. The method of claim 8, wherein at least one I-PAT score of the plurality of I-PAT scores corresponds to a high defectivity semiconductor die, wherein the one or more adaptive tests includes a test configured to apply a complete characterization of fault detection and coverage to the high defectivity semiconductor die.

14. The method of claim 8, wherein the generating the one or more adaptive tests for the at least one semiconductor die of the plurality of semiconductor dies is based on the dynamic decision-making process and at least one of:
die level electrical sort data generated by one or more electrical sort processes; or
statistical prediction feedback generated by one or more statistical prediction processes.

15. A system comprising:
an inline defect part average testing (I-PAT) system, wherein the I-PAT system is configured to receive semiconductor die data for a plurality of semiconductor dies and generate a plurality of I-PAT scores based on the semiconductor die data, wherein the semiconductor die data includes characterization measurements for the plurality of semiconductor dies, wherein each I-PAT score of the plurality of I-PAT scores represents a weighted defectivity determined by the I-PAT system based on a characterization measurement of a corresponding semiconductor die of the plurality of semiconductor dies; and an adaptive test controller communicatively coupled to the I-PAT system, wherein the adaptive test controller includes one or more processors and memory, wherein the memory is configured to store a set of program instructions, wherein the one or more processors are configured to execute program instructions causing the one or more processors to:
receive the plurality of I-PAT scores from the I-PAT system;
apply one or more rules to the plurality of I-PAT scores during a dynamic decision-making process; and
generate one or more adaptive tests for at least one semiconductor die of the plurality of semiconductor dies based on the dynamic decision-making process.

16. The system of claim 15, further comprising:
a semiconductor fabrication and characterization system configured to acquire the characterization measurements of the semiconductor die data,
wherein the one or more processors are further configured to execute program instructions causing the one or more processors to:
determine one or more adjustments to the semiconductor fabrication and characterization system based on the one or more adaptive tests.

17. The system of claim 15, wherein at least one I-PAT score of the plurality of I-PAT scores corresponds to a low defectivity semiconductor die defined by a selected threshold, wherein the one or more adaptive tests comprise an optimized baseline test for the low defectivity semiconductor die.

18. The system of claim 15, wherein at least one I-PAT score of the plurality of I-PAT scores corresponds to a moderate defectivity semiconductor die defined by a selected threshold and a second selected threshold, wherein the one or more adaptive tests includes an adaptable test configured to add one or more test program parameters to a baseline test program for the moderate defectivity semiconductor die, wherein the one or more test program parameters includes at least one of an additional test vector, test pattern, or fault model.

19. The system of claim 15, wherein at least one I-PAT score of the plurality of I-PAT scores corresponds to a high defectivity semiconductor die defined by a second selected threshold, wherein the one or more adaptive tests includes a skip test configured to not test the high defectivity semiconductor die.

20. The system of claim 15, wherein at least one I-PAT score of the plurality of I-PAT scores corresponds to a high defectivity semiconductor die, wherein the one or more adaptive tests includes a test configured to apply a complete characterization of fault detection and coverage to the high defectivity semiconductor die.

21. The system of claim 15, wherein the one or more processors are further configured to execute program instructions causing the one or more processors to:
generate the one more adaptive tests for the at least one semiconductor die of the plurality of semiconductor dies based on the dynamic decision-making process and at least one of:
die level electrical sort data generated by one or more electrical sort processes; or
statistical prediction feedback generated by one or more statistical prediction processes.

22. The system of claim 15, wherein the I-PAT system is configured to bin the I-PAT scores prior to transmission to the adaptive test controller.

23. The system of claim 15, wherein the I-PAT system is configured to receive the semiconductor die data in a first data format, and transmit the I-PAT scores in a second data format.

24. The system of claim 15, wherein the I-PAT system is configured to convert the I-PAT scores into a standardized data format prior to transmission of the I-PAT scores to the adaptive test controller.

25. The system of claim 15, wherein the adaptive test controller is configured to convert the I-PAT scores into a standardized data format after receipt of the I-PAT scores from the I-PAT system.

* * * * *